United States Patent
Boisvert et al.

(10) Patent No.: US 6,872,456 B2
(45) Date of Patent: Mar. 29, 2005

(54) SILOXANE RESINS

(75) Inventors: Ronald Paul Boisvert, Midland, MI (US); Duane Raymond Bujalski, Auburn, MI (US); Kai Su, Midland, MI (US)

(73) Assignee: Dow Corning Corporation, Midland, MI (US)

(*) Notice: Subject to any disclaimer, the term of this patent is extended or adjusted under 35 U.S.C. 154(b) by 556 days.

(21) Appl. No.: 09/915,902

(22) Filed: Jul. 26, 2001

(65) Prior Publication Data

US 2003/0087082 A1 May 8, 2003

(51) Int. Cl.$^7$ .............................................. B32B 25/20
(52) U.S. Cl. .......................... 428/447; 528/39; 528/12; 556/457; 556/482; 427/387
(58) Field of Search .................. 428/447; 427/387; 528/39, 12; 556/457, 482

(56) References Cited

U.S. PATENT DOCUMENTS

| | | | |
|---|---|---|---|
| 3,615,272 A | 10/1971 | Collins et al. | 23/366 |
| 3,730,743 A | * 5/1973 | Mcleod | |
| 4,756,977 A | 7/1988 | Haluska et al. | 428/704 |
| 5,446,088 A | 8/1995 | Haluska | 524/588 |
| 6,022,814 A | 2/2000 | Mikoshiba et al. | 438/789 |
| 6,143,360 A | 11/2000 | Zhong | 427/244 |
| 6,184,260 B1 | 2/2001 | Zhong | 521/77 |
| 6,197,913 B1 | 3/2001 | Zhong | 528/31 |
| 6,231,989 B1 | 5/2001 | Chung et al. | 428/447 |
| 6,232,424 B1 | 5/2001 | Zhong et al. | 528/12 |
| 6,313,045 B1 | 11/2001 | Zhong et al. | 438/758 |
| 6,359,096 B1 | 3/2002 | Zhong et al. | 528/12 |

FOREIGN PATENT DOCUMENTS

| | | | |
|---|---|---|---|
| EP | 0 997 497 A1 | 3/2000 | C08L/83/04 |
| EP | 1 095 958 A1 | 2/2001 | C08G/77/02 |
| JP | 5-333553 | 12/1993 | G03F/7/075 |
| WO | WO 98/49721 | 11/1998 | H01L/21/316 |

OTHER PUBLICATIONS

U.S. Appl. No. 09/915,899.*
U.S. Appl. No. 09/915,903.*
U.S. Appl. No. 09/723,051.*
U.S. Appl. No. 09/425,901.*
U.S. Appl. No. 09/951,819.*
U.S. Appl. No. 09/951,665.*
Journal of Materials Chemistry; "Preparation of low density poly (methylsilsesquioxane)s for LSI interlayer dielectrics with low dielectric constant. Fabrication of Angstrom size pores prepared by baking trifluoropropylsilyl copolymers", Satoshi Mikoshiba and Shuzi Hayase, 1999, 9, 591–598.

* cited by examiner

*Primary Examiner*—Kuo-Liang Peng
(74) *Attorney, Agent, or Firm*—Sharon K. Severance

(57) ABSTRACT

This invention pertains to a siloxane resin composition comprising $R^1SiO_{3/2}$ siloxane units, $R^2SiO_{3/2}$ siloxane units and $(R^3O)_bSiO_{(4-b)/2}$ siloxane units wherein $R^1$ is an alkyl group having 1 to 5 carbons, hydrogen, or mixtures thereof; $R^2$ is a monovalent organic group having 6 to 30 carbons; $R^3$ is a branched alkyl group having 3 to 30 carbons, b is from 1 to 3; and the siloxane resin contains from 2.5 to 85 mole percent $R^1SiO_{3/2}$ units, 2.5 to 50 mole percent $R^2SiO_{3/2}$ units and 5 to 95 mole percent $(R^3O)_bSiO_{(4-b)/2}$ units. The siloxane resin is useful to make insoluble porous resin and insoluble porous coatings. Heating a substrate coated with the siloxane resin at a sufficient temperature effects removal of the $R^2$ and $R^3O$ groups to form an insoluble insoluble porous coating having a porosity of 1 to 60 volume percent and a dielectric constant in the range of 1.5 to 3.0.

19 Claims, No Drawings

SILOXANE RESINS

FIELD OF THE INVENTION

This invention pertains to a siloxane resin composition comprising $R^1SiO_{3/2}$ siloxane units, $R^2SiO_{3/2}$ siloxane units and $(R^3O)_bSiO_{(4-b)/2}$ siloxane units wherein $R^1$ is independently selected from the group consisting of alkyl having 1 to 5 carbon atoms, hydrogen, and mixtures thereof; $R^2$ is independently selected from the group consisting of monovalent organic groups having 6 to 30 carbon atoms and monovalent substituted organic groups having 6 to 30 carbon atoms; $R^3$ is independently selected from the group consisting of branched alkyl groups having 3 to 30 carbon atoms and branched substituted alkyl groups having 3 to 30 carbon atoms, and b is from 1 to 3. This invention further pertains to insoluble porous resins and insoluble porous coatings produced from the siloxane resin composition.

BACKGROUND OF THE INVENTION

Semiconductor devices often have one or more arrays of patterned interconnect levels that serve to electrically couple the individual circuit elements forming an integrated circuit (IC). The interconnect levels are typically separated by an insulating or dielectric coating. Previously, a silicon oxide coating formed using chemical vapor deposition (CVD) or plasma enhanced techniques (PECVD) was the most commonly used material for such dielectric coatings. However, as the size of circuit elements and the spaces between such elements decreases, the relatively high dielectric constant of such silicon oxide coatings (i.e. about 4) is inadequate to provide adequate electrical insulation.

In order to provide a lower dielectric constant than that of silicon oxide, dielectric coatings formed from siloxane-based resins have found use. An example of such coatings are those formed from hydrogen silsesquioxane resins as described for example in Collins et al., U.S. Pat. No. 3,615,272 and Haluska et al. U.S. Pat. No. 4,756,977. While such coatings provide lower dielectric constants than CVD or PECVD silicon oxide coatings and also provide other benefits such as enhanced gap filling and surface planarization, typically the dielectric constants of such coatings are limited to approximately 3 or greater.

It is well known that the dielectric constant of insulating coatings is an important factor where IC's with low power consumption, cross talk, and signal delay are required. As IC dimensions continue to shrink, this factor increases in importance. As a result, siloxane based resin materials and methods for making such materials that can provide electrically insulating coatings with dielectric constants below 3 are desirable. In addition it is desirable to have siloxane-based resins and methods for making such resins that provide coatings which have a high resistance to cracking. Also, it is desirable for such siloxane-based resins to provide coatings by standard processing techniques such as spin coating. It is known that the dielectric constant of solid coatings decrease with a decrease in density of the coating material. A porous coating typically has a lower density than a corresponding solid coating.

Haluska, U.S. Pat. No. 5,446,088 describes a method of co-hydrolyzing silanes of the formulas $HSi(OR)_3$ and $Si(OR)_4$ to form co-hydrolysates useful in the formation of coatings. The R group is an organic group containing 1–20 carbon atoms, which when bonded to silicon through the oxygen atom, forms a hydrolyzable substituent. Especially preferred hydrolyzable groups are methoxy and ethoxy. The hydrolysis with water is carried out in an acidified oxygen containing polar solvent. The co-hydrolyzates in a solvent are applied to a substrate, the solvent evaporated and the coating heated to 50 to 1000° C. to convert the coating to silica. Haluska does not disclose silanes having branched alkoxy groups.

Chung et al., U.S. Pat. No. 6,231,989 describe a method for forming a porous coating from hydrogen silsesquioxane resins. A porous network is formed by depositing a coating on a substrate with a solution comprising a hydrogen silsesquioxane resin and a solvent in a manner in which at least 5 volume % of the solvent remains in the coating after deposition. The coating is then exposed to an environment comprising a basic catalyst and water; the solvent is evaporated from the coating to form a porous network with a dielectric constant in the range of 1.5 to 2.4.

Smith et al., WO 98/49721, describe a process for forming a nanoporous dielectric coating on a substrate. The process comprises the steps of blending an alkoxysilane with a solvent composition and optional water; depositing the mixture onto a substrate while evaporating at least a portion of the solvent; placing the substrate in a sealed chamber and evacuating the chamber to a pressure below atmospheric pressure; exposing the substrate to water vapor at a pressure below atmospheric pressure and then exposing the substrate to base vapor.

Mikoshiba et al., U.S. Pat. No. 6,022,814, describe a process for forming silicon oxide films on a substrate from hydrogen or methyl siloxane-based resins having organic substituents that are removed at a temperature ranging from 250° C. to the glass transition point of the resin. Silicon oxide film properties reported include a density of 0.8 to 1.4 g/cm³, an average pore diameter of 1 to 3 nm, a surface area of 600 to 1,500 $m^2/g$ and a dielectric constant in the range of 2.0 to 3.0. The useful organic substituents that can be oxidized at a temperature of 250° C. or higher that were disclosed include substituted and unsubstituted alkyl or alkoxy groups exemplified by 3,3,3-triflouropropyl, β-phenethyl group, t-butyl group, 2-cyanoethyl group, benzyl group, and vinyl group.

Mikoskiba et al., *J. Mat. Chem.*, 1999, 9, 591–598, report a method to fabricate angstrom size pores in methylsilsesquioxane coatings in order to decrease the density and the dielectric constant of the coatings. Copolymers bearing methyl (trisiloxysilyl) units and alkyl (trisiloxysilyl) units were spin-coated on to a substrate and heated at 250° C. to provide rigid siloxane matrices. The coatings were then heated at 450° C. to 500° C. to remove thermally labile groups and holes were left corresponding to the size of the substituents, having a dielectric constant of about 2.3. Trifluoropropyl, cyanoethyl, phenylethyl, and propyl groups were investigated as the thermally labile substituents.

Ito et al., Japanese Laid-Open Patent (HEI) 5-333553, describe preparation of a siloxane resin containing alkoxy and silanol functionality by the hydrolysis of diacetoxydi(tertiarybutoxy)silane in the presence of a proton acceptor. The resin is radiation cured in the presence of a photo acid with subsequent thermal processing to form an $SiO_2$ like coating and can be used as a photo resist material for IC fabrication.

It has now been found that incorporation of organic groups having 6 to 30 carbon atoms and branched alkoxy groups having 3 to 30 carbon atoms into siloxane resins provides several advantages such as improved storage stability, increased modulus and increased porosity of the cured resins, while retaining a dielectric constant in the range of 1.5 to 3.0. It is therefore an object of this invention to show a siloxane resin composition having improved storage stability. It is also an object of this invention to show a method for making siloxane resins and a method for curing these resins to produce insoluble porous coatings having a dielectric constant of 1.5 to 3.0, a porosity from 1 to 60 volume percent and a modulus from 1.0 to 10 GPa. These coatings have the advantage that they may be formed using conventional thin film processing.

SUMMARY OF THE INVENTION

This invention pertains to a siloxane resin composition comprising:

(A) 2.5 to 85 mole parts of $R^1SiO_{3/2}$ siloxane units wherein $R^1$ is independently selected from the group consisting of alkyl having 1 to 5 carbon atoms, hydrogen, and mixtures thereof;

(B) 2.5 to 50 mole parts of $R^2SiO_{3/2}$ siloxane units wherein $R^2$ is independently selected from the group consisting of monovalent organic groups having 6 to 30 carbon atoms and monovalent substituted organic groups having 6 to 30 carbon atoms; and (C) 5 to 95 mole parts of $(R^3O)_bSiO_{(4-b)/2}$ siloxane units, wherein $R^3$ is independently selected from the group consisting of branched alkyl groups having 3 to 30 carbon atoms and branched substituted alkyl groups having 3 to 30 carbon atoms, b is from 1 to 3. The total amount of components (A), (B) and (C) is 100 mole parts and the sum of components (A), (B) and (C) is at least 50 percent of the total siloxane units in the resin composition.

This invention also pertains to a method for making siloxane resins by reacting a silane or a mixture of silanes of the formula $R^1SiX_3$, a silane or a mixture of silanes of the formula $R^2SiX_3$, and a silane or a mixture of silanes of the formula $(R^3O)_cSiX_{(4-c)}$ where $R^1$ is independently selected from the group consisting of alkyl groups having 1 to 5 carbon atoms, hydrogen, and mixtures thereof; $R^2$ is independently selected from the group consisting of monovalent organic groups having 6 to 30 carbon atoms and substituted monovalent organic groups having 6 to 30 carbon atoms; $R^3$ is independently selected from the group consisting of branched alkyl groups and substituted branched alkyl groups having 3 to 30 carbon atoms; c is from 1 to 3 and X is a hydrolyzable group or a hydroxy group.

This invention further pertains to a method of forming a an insoluble porous resin and to a method of forming an insoluble porous coating on a substrate. The insoluble porous coatings have a dielectric constant in the range of 1.5 to 3.0, a porosity of 1 to 60 volume percent and a modulus in the range of 1.0 to 10 GPa.

DETAILED DESCRIPTION OF THE INVENTION

The siloxane resin composition comprises:

(A) 2.5 to 85 mole parts of $R^1SiO_{3/2}$ siloxane units wherein $R^1$ is independently selected from the group consisting of alkyl having 1 to 5 carbon atoms, hydrogen, and mixtures thereof;

(B) 2.5 to 50 mole parts of $R^2SiO_{3/2}$ siloxane units wherein $R^2$ is independently selected from the group consisting of monovalent organic groups having 6 to 30 carbon atoms and monovalent substituted organic groups having 6 to 30 carbon atoms; and (C) 5 to 95 mole parts of $(R^3O)_bSiO_{(4-b)/2}$ siloxane units, wherein $R^3$ is independently selected from the group consisting of branched alkyl groups having 3 to 30 carbon atoms and branched substituted alkyl groups having 3 to 30 carbon atoms, b is from 1 to 3. The total amount of components (A), (B) and (C) is 100 mole parts and the sum of components (A), (B) and (C) is at least 50 percent of the total siloxane units in the resin composition. It is preferred that the siloxane resin contains an average of 30 to 60 mole parts component (A), 10 to 25 mole parts component (B) and 20 to 50 mole parts (C) where the total amount of components (A), (B) and (C) combined is 100 mole parts and the sum of (A), (B) and (C) is at least 70 percent of the total siloxane units in the resin composition.

The structure of the siloxane resin is not specifically limited. The siloxane resins may be essentially fully condensed or may be only partially reacted (i.e., containing less than 10 mole % Si—OR and/or less than 30 mole % Si—OH). The partially reacted siloxane resins may be exemplified by, but not limited to, siloxane units such as $R^1Si(X)_dO_{(3-d/2)}$; $R^2Si(X)_dO_{(3-d/2)}$; and $Si(X)_d(OR^3)_fO_{(4-d-f/2)}$; in which $R^1$, $R^2$, and $R^3$ are defined above; each X is independently a hydrolyzable group or a hydroxy group, and d and f are from 1 to 2. The hydrolyzable group is an organic group attached to a silicon atom through an oxygen atom (Si—OR) forming a silicon bonded alkoxy group or a silicon bonded acyloxy group. R is exemplified by, but not limited to, linear alkyl groups having 1 to 6 carbon atoms such as methyl, ethyl, propyl, butyl, pentyl, or hexyl and acyl groups having 1 to 6 carbon atoms such as formyl, acetyl, propionyl, butyryl, valeryl or hexanoyl. The siloxane resin may also contain less than about 10 mole percent $SiO_{4/2}$ units.

The siloxane resins have a weight average molecular weight in a range of 400 to 160,000 and preferably in a range of 5,000 to 100,000.

$R^1$ can be a linear alkyl group having 1 to 5 carbon atoms, hydrogen and mixtures thereof. The alkyl group is exemplified by, but not limited to, methyl, ethyl, propyl, butyl, and pentyl. It is preferred that $R^1$ is methyl, hydrogen or mixtures thereof.

$R^2$ can be a substituted or unsubstituted linear, branched or cyclic monovalent organic group having 6 to 30 carbon atoms. The substituted organic group can be substituted with substituents in place of a carbon bonded hydrogen atom (C—H). Substituted $R^2$ groups are exemplified by, but not limited to, halogen such as chlorine or fluorine, ether, poly(oxyalkylene) groups described by formula $CH_3O(CH_2)_mO)_p(CH_2)_q$— where m, p and q are positive integers and preferably a positive integer of 1 to 9, alkoxy, acyloxy, acyl, alkoxycarbonyl and trialkylsiloxy groups. Examples of $R^2$ include, but are not limited to, hexyl, heptyl, octyl, nonyl, decyl, dodecyl, hexadecyl, triisobutyl, tetraisobutyl, trimethylsiloxyhexadecyl, octadecyl, $CH_3(CH_2)_{11}OCH_2CH_2$—, $CH_3O(CH_2CH_2O)_{7-9}(CH_2)_3$—, $(CH_3)_3CCH_2(CH_3)_2C(CH_3)_3CCH_2CHCH_2$—, $CF_3(CF_2)_5CH_2CH_2$—, phenylethyl, p-methylphenylethyl, p-methoxyphenylethyl, and p-bromophenylethyl. $R^2$ is preferably a substituted or unsubstituted alkyl group having 10 to 20 carbon atoms.

$R^3$ is a substituted or unsubstituted branched alkyl group having 3 to 30 carbon atoms. The substituted branched alkyl group can be substituted with substituents in place of a carbon bonded hydrogen atom (C—H). Substituted $R^2$ groups are exemplified by, but not limited to, halogen such as chlorine and fluorine, alkoxycarbonyl such as described by formula —$(CH_2)_aC(O)O(CH_2)_bCH_3$, alkoxy substitution such as described by formula —$(CH_2)_aO(CH_2)_bCH_3$, and carbonyl substitution such as described by formula —$(CH_2)_aC(O)(CH_2)_bCH_3$, where $a \geq 0$ and $b \geq 0$. Unsubstituted $R^3$ groups are exemplified by, but not limited to, isopropyl, isobutyl, sec-butyl, tert-butyl, isopentyl, neopentyl, tert-pentyl, 2-methylbutyl, 2-methylpentyl, 2-methylhexyl, 2-ethylbutyl, 2-ethylpentyl, 2-ethylhexyl, etc. Preferably $R^3$ is a tertiary alkyl having 4 to 18 carbon atoms and more preferably $R^3$ is t-butyl.

The method for preparing the siloxane resin comprises: combining (a) a silane or a mixture of silanes of the formula $R^1SiX_3$, where each $R^1$ is independently selected from the group consisting of alkyl having 1 to 5 carbon atoms, hydrogen and mixtures thereof, X is independently a hydrolyzable group or a hydroxy group;

(b) a silane or a mixture of silanes of the formula $R^2SiX_3$, where $R^2$ is independently selected from the group consisting of monovalent organic groups having 6 to 30 carbon atoms and substituted monovalent organic groups having 6 to 30 carbon atoms, X is independently a hydrolyzable group or a hydroxy group;

(c) a silane or a mixture of silanes of the formula $(R^3O)_cSiX_{(4-c)}$, where $R^3$ is independently selected from the group consisting of branched alkyl groups having 3 to 30 carbon atoms and branched substituted alkyl groups having 3 to 30 carbon atoms, c is from 1 to 3 inclusive, X is independently a hydrolyzable group or a hydroxy group; and (d) water, for a time and temperature sufficient to effect the formation of the siloxane resin.

Silane (a) is a silane or a mixture of silanes of the formula $R^1SiX_3$, where each $R^1$ is independently selected from the group consisting of alkyl having 1 to 5 carbon atoms described above, hydrogen and mixtures thereof. It is preferred that $R^1$ is methyl, hydrogen or mixtures thereof. X is a hydrolyzable group or a hydroxy group. By "hydrolyzable group" it is meant that greater than 80 mole percent of X reacts with water (hydrolyzes) under the conditions of the reaction to effect formation of the siloxane resin. The hydroxy group is a condensable group in which at least 70 mole percent reacts with another X group bonded to a different silicon atom to condense and form a siloxane bond (Si—O—Si). The hydrolyzable group is an amino group or an organic group attached to a silicon atom through an oxygen atom (Si—OR) forming a silicon bonded alkoxy group or a silicon bonded acyloxy group. When X is an amino group, it is generally limited to compositions where $R^1$ is alkyl or contains less than 10 mole percent hydrogen, since amino may be detrimental to the stability of hydrogen containing siloxane resins. Also, when X is amino, it is typically used at less than about 30 mole percent because the resulting siloxane resin may contain greater than 30 mole percent SiOH. R is exemplified by, but not limited to, linear alkyl groups having 1 to 6 carbon atoms such as methyl, ethyl, propyl, butyl, pentyl, or hexyl and acyl groups having 1 to 6 carbon atoms such as formyl, acetyl, propionyl, butyryl, valeryl or hexanoyl. It is preferred that silane (a) be trimethoxysilane, triethoxysilane, methyltrimethoxysilane or methyltriethoxysilane because of their easy availability. Typically, silane (a) is present in an amount from 2.5 to 85 mole parts per 100 mole parts total of silane (a), silane (b) and silane (c) combined and preferably 30 to 60 mole parts on the same basis.

Silane (b) is a silane or a mixture of silanes of the formula $R^2SiX_3$, where $R^2$ is independently selected from the group consisting of monovalent organic groups having 6 to 30 carbon atoms and substituted monovalent organic groups having 6 to 30 carbon atoms as described above. X is independently a hydrolyzable group or a hydroxy group as described above. It is preferred that silane (b) be $R^2Si(OMe)_3$ and $R^2Si(OEt)_3$ where Me stands for methyl and Et stands for ethyl because of their easy availability. Typically, silane (b) is present in an amount from 2.5 to 50 mole parts per 100 mole parts total of silane (a), silane (b) and silane (c) combined and preferably 10 to 25 mole parts on the same basis.

Silane (c) is a silane or a mixture of silanes of the formula $(R^3O)_cSiX_{(4-c)}$, where $R^3$ is independently selected from the group consisting of branched alkyl groups having 3 to 30 carbon atoms and substituted branched alkyl groups having 3 to 30 carbon atoms as described above, c is from 1 to 3, and X is independently a hydrolyzable group or a hydroxy group as described above. It is preferred that silane (c) be di-t-butoxydihydroxysilane, di-t-butoxydimethoxysilane, di-t-butoxydiethoxysilane, and di-t-butoxydiacetoxysilane because of their easy availability. Typically, silane (c) is present in an amount from 5 to 95 mole parts per 100 mole parts total of silane (a), silane (b) and silane (c) combined and preferably 20 to 50 mole parts on the same basis.

Water is present in an amount to effect hydrolysis of the hydrolyzable group, X. Typically water is present in an amount of 0.5 to 2.0 moles of water per mole of X in silanes (a), (b) and (c) and more preferably 0.8 to 1.2 moles on the same basis.

The reaction to effect formation of the siloxane resin can be carried out in the liquid state with or without a solvent. If a solvent is used, it can include any suitable organic solvent that does not contain functional groups which may participate in the reaction and is a solvent for silanes (a), (b) and (c). The solvent is exemplified by, but not limited to, saturated aliphatics such as n-pentane, hexane, n-heptane, isooctane and dodecane; cycloaliphatics such as cyclopentane and cyclohexane; aromatics such as benzene, toluene, xylene and mesitylene; cyclic ethers such as tetrahydrofuran (THF) and dioxane; ketones such as methylisobutyl ketone (MIBK); halogen substituted alkanes such as trichloroethane; halogenated aromatics such as bromobenzene and chlorobenzene; and alcohols such as methanol, ethanol, propanol, butanol. Additionally, the above solvents may be used in combination of two or more as co solvents. Preferred solvents are aromatic compounds and cyclic ethers, with toluene, mesitylene and tetrahydrofuran being most preferred. When a solvent is used, it is generally used within a range of 40 to 95 weight percent solvent based on the total weight of solvent and silanes (a), (b) and (c). More preferred is 70 to 90 weight percent solvent on the same basis.

Combining components (a), (b), (c), (d) and optionally a solvent (if it is used) may be done in any order as long as there is contact between any hydrolyzable groups (X) and water, so that the reaction proceed to effect formation of the siloxane resin. Generally the silanes are dissolved in the solvent and then the water is added to the solution. Some reaction usually occurs when the above components are combined. To increase the rate and extent of reaction, however, various facilitating measures such as temperature control and/or agitation are utilized.

The temperature at which the reaction is carried out is not critical as long as it does not cause significant gelation or cause curing of the siloxane resin product. Generally the temperature can be in a range of 20° C. to 150° C., with a temperature of 20° C. to 100° C. being preferred. When X is an acyloxy group such as acetoxy, it is preferred to conduct the reaction at or below 50° C. The time to form the siloxane resin is dependent upon a number of factors such as, but not limited to, the specific silanes being used, the temperature and the mole ratio of $R^1$, $R^2$ and $R^3$ desired in the siloxane resin product of the reaction. Typically, the reaction time is from several minutes to several hours. To increase the molecular weight of the siloxane resin prepared and to improve the storage stability of the siloxane resin it is preferred to carry out a bodying step subsequent to or as part of the above reaction. By "bodying" it is meant that the reaction is carried out over several hours with heating from 40° C. up to the reflux temperature of the solvent to effect the increase in weight average molecular weight. It is preferred that the reaction mixture be heated such that the siloxane resin after heating has a weight average molecular weight in the range of about 5,000 to 100,000.

When X is an acyloxy group such as acetoxy, the corresponding acid such as acetic acid is produced as a by-product of the reaction. Since the presence of acetic acid may adversely affect the stability of the siloxane resin product, it is desirable that any acetic acid be neutralized. Neutralization of the by-product acetic acid may be effected by contacting the reaction mixture with a neutralizing agent or by removal via distillation. The distillation is generally accomplished by the addition of solvent such as toluene (if it is not already present) and removing the acetic acid under reduced pressure and heat (i.e. up to 50° C.) as an azeotrope with the solvent. If a neutralizing agent is used, it must be sufficiently basic to neutralize any remaining acetic acid and yet insufficiently basic so that it does not catalyze rearrangement of the siloxane resin product. Examples of suitable bases include calcium carbonate, sodium carbonate, sodium bicarbonate, ammonium carbonate, ammonia, calcium oxide or calcium hydroxide. Neutralization may be accomplished by any suitable means such as stirring in a powdered neutralizing agent followed by filtration or by passing the reaction mixture and any additional solvent over or through a bed of particulate neutralizing agent of a size which does not impede flow. The bodying step described herein above, is generally carried out after neutralization and/or removal of the by-product acetic acid.

The siloxane resin may be recovered in solid form by removing the solvent if a solvent was used. The method of solvent removal is not critical and numerous approaches are well known in the art. For example, a process comprising removing the solvent by distillation under vacuum and heat (i.e. 50° C. to 120° C.) may be used. Alternatively, if it is desired to have the siloxane resin in a particular solvent, a solvent exchange may be done by adding a secondary solvent and distilling off the first solvent. Siloxane resins containing greater than 10 weight percent silicon bonded hydrogen (Si—H) are generally kept as solutions, while those with less Si—H may be stored in solid form.

An insoluble porous resin may be obtained by heating the siloxane resin for a time and temperature sufficient to effect curing of the siloxane resin and removal of the $R^2$ and $R^3O$ groups, thereby forming an insoluble porous resin. By "removal" it is meant that greater than about 80 mole percent of the $R^2$ and $R^3O$ groups bonded to silicon atoms have-been removed as volatile hydrocarbon and hydrocarbon fragments which generate voids in the coating, resulting in the formation of an insoluble porous resin. The heating may be conducted in a single-step process or in a two-step process. In the two-step heating process the siloxane resin is first heated for a time and temperature sufficient to effect curing without significant removal of the $R^2$ and $R^3O$ groups. Generally this temperature can be in a range of from greater than 20° C. to 350° C. for several minutes to several hours. Then the cured siloxane resin is further heated for a time and temperature (for several minutes to several hours) within a range of greater than 350° C. up to the lesser of the decomposition of the siloxane resin backbone or $R^1$ groups bonded to silicon atoms described herein above to effect removal of the $R^2$ and $R^3O$ groups from the silicon atoms. Typically, the removal step is conducted at a temperature in a range of greater than 350° C. to 600° C., with a temperature range of 400° C. to 550° C. being preferred. During the curing and heating step, greater than 90 moles percent of the alkyl containing $R^1$ groups remain on the siloxane resin and greater than 70 mole percent of the hydrogen containing $R^1$ groups remain on the siloxane resin. The porosity in the final insoluble porous resin can be controlled by the mole percent of $R^2$ and $R^3O$ groups in the siloxane resin and how the siloxane resin is heated. The insoluble porous resins formed from siloxane resins containing both $R^2$ and $R^3O$ groups incorporated into the siloxane resin generally result in an increase in porosity, typically about 10 volume percent, when compared with siloxane resins cured under similar conditions which contain only $R^2$ or $R^3O$ groups incorporated into the siloxane resin of similar compositions (i.e. the mol % of total $R^2$ or $R^3O$ leaving groups is approximately the same).

In the single-step process the curing of the siloxane resin and removal of the $R^2$ and $R^3O$ groups are effected simultaneously by heating for a time and temperature within a range of greater than 20° C. up to the lesser of the decomposition of the siloxane resin backbone or the $R^1$ groups bonded to silicon atoms described herein above to effect removal of the $R^2$ and $R^3O$ groups from the cured siloxane resin. Generally, it is preferred that the curing/removal step be conducted at a temperature in a range of greater than 350° C. to 600° C., with a temperature in a range of 400° C. to 550° C. being most preferred.

It is preferred that the heating takes place in an inert atmosphere, although other atmospheres may be used. Inert atmospheres useful herein include, but are not limited to, nitrogen, helium and argon with an oxygen level less than 50 parts per million and preferably less than 15 parts per million. Heating may also be conducted at any effective atmospheric pressure from vacuum to above atmospheric and under any effective oxidizing or non-oxidizing gaseous environment such as those comprising air, $O_2$, oxygen plasma, ozone, ammonia, amines, moisture, $N_2O$, hydrogen, etc.

The insoluble porous resins may be useful as porous materials with controllable porosity and high temperature stability up to 600° C. such as shape selective gas or liquid permeable membranes, catalyst supports, energy storage systems such as batteries and molecular separation and isolation. By the term "porous" it is meant an insoluble porous resin having a porosity in a range of from 1 to 60 volume percent. Porosity in the range of 10 to 60 volume percent is preferred. The modulus of the insoluble porous resins ranges from 1.0 to 10 GPa.

The siloxane resins may be used to prepare a porous coating on a substrate by:

(A) coating the substrate with a coating composition comprising a siloxane resin composition having
  (a) 2.5 to 85 mole parts of $R^1SiO_{3/2}$ siloxane units wherein $R^1$ is selected from the group consisting of alkyl having 1 to 5 carbon atoms, hydrogen, and mixtures thereof,
  (b) 2.5 to 50 mole parts of $R^2SiO_{3/2}$ siloxane units wherein $R^2$ is selected from the group consisting of monovalent organic groups having 6 to 30 carbon atoms and monovalent substituted organic groups having 6 to 30 carbon atoms as described herein above, and (c) 5 to 95 mole parts of $(R^3O)_bSiO_{(4-b)/2}$ siloxane units, wherein $R^3$ is selected from the group consisting of branched alkyl groups having 3 to 30 carbon and branched substituted alkyl groups having 3 to 30 carbon atoms as described herein above, b is 1 to 3, the total amount of components (a), (b) and (c) combined is 100 mole parts and the sum of (a), (b) and (c) is at least 50 percent of total siloxane units in the resin composition;

(B) heating the coated substrate to a temperature sufficient to effect curing of the coating composition, and (C) further heating the coated substrate to a temperature sufficient to effect removal of the $R^2$ and $R^3O$ groups from the cured coating composition, thereby forming an insoluble porous coating on the substrate. It is preferred that the siloxane resin contains an average of 30 to 60 mole parts (a), 10 to 25 mole parts (b) and 20 to 50 mole (c) per 100 mole parts total amount of (a), (b) and (c) and the sum of (a), (b) and (c) is at least 70 percent of total siloxane units in the resin composition.

The siloxane resin is typically applied to a substrate as a solvent dispersion. Solvents which may be used include any agent or mixture of agents which will dissolve or disperse the siloxane resin to form a homogeneous liquid mixture without affecting the resulting coating or the substrate. The solvent can generally be any organic solvent that does not contain functional groups which may participate in a reaction with the siloxane resin, such as hydroxyl, exemplified by those discussed herein above for the reaction of the silane mixture with water.

The solvent is present in an amount sufficient to dissolve the siloxane resin to the concentration desired for a particular application. Typically the solvent is present in an amount of 40 to 95 weight percent, preferably from 70 to 90 weight percent based on the weight of the siloxane resin and solvent. If the siloxane resin has been retained in a solvent described herein above, the solvent may be used in coating the substrate, or if desired a simple solvent exchange may be performed by adding a secondary solvent and distilling off the first solvent.

Specific methods for application of the siloxane resin to a substrate include, but are not limited to spin coating, dip coating, spray coating, flow coating, screen printing or others. The preferred method for application is spin coating. When a solvent is used, the solvent is allowed to evaporate from the coated substrate resulting in the deposition of the siloxane resin coating on the substrate. Any suitable means for evaporation may be used such as simple air drying by exposure to an ambient environment, by the application of a vacuum, or mild heat (up to 50° C.) or during the early stages of the curing process. When spin coating is used, the additional drying method is minimized since the spinning drives off the solvent.

Following application to the substrate, the siloxane resin coating is heated at a temperature sufficient to effect cure of the siloxane resin and removal of the $R^2$ and $R^3O$ groups bonded to silicon atoms, thereby forming an insoluble porous coating. By "cured coating composition" it is meant that the coating is essentially insoluble in the solvent from which the siloxane resin was deposited onto the substrate or any solvent delineated above as being useful for the application of the siloxane resin. By "removal" it is meant that greater than 80 mole percent of the $R^2$ and $R^3O$ groups bonded to silicon atoms have been removed as volatile hydrocarbon and hydrocarbon fragments which generate voids in the coating, resulting in the formation of a porous resin. The heating may be conducted in a single-step process or in a two-step process. In the two-step heating process the siloxane resin is first heated at a temperature sufficient to effect curing without significant removal of the $R^2$ and $R^3O$ groups. Generally this temperature can be in a range of from greater than 20° C. to 350° C. Then the cured siloxane resin coating is further heated at a temperature within a range of greater than 350° C. up to the lesser of the decomposition of the siloxane resin backbone or the $R^1$ groups bonded to silicon atoms described herein above to effect removal of the $R^2$ and $R^3O$ groups (leaving groups) from the silicon atoms. Generally, it is preferred that the removal step be conducted at a temperature in a range of greater than 350° C. to 600° C., with a temperature in a range of 400° C. to 550° C. being most preferred. During the curing and heating step, greater than 90 mole percent of alkyl containing $R^1$ groups remain on the siloxane resin and greater than 70 mole percent of hydrogen containing $R^1$ groups remain on the siloxane resin.

In the single-step process the curing of the siloxane resin and removal of the $R^2$ and $R^3O$ groups are effected simultaneously by heating at a temperature within a range of greater than 20° C. up to the lesser of the decomposition of the siloxane resin backbone or the $R^1$ groups bonded to silicon atoms described herein above to effect removal of the $R^2$ and $R^3O$ groups from the cured coating composition. Generally, it is preferred that the curing/removal step be conducted at a temperature in a range of greater than 350° C. to 600° C., with a temperature in a range of 400° C. to 550° C. being most preferred. The porosity in the final insoluble porous resin can be controlled by the mole percent of $R^2$ and $R^3O$ groups in the siloxane resin and how the siloxane resin is heated.

It is preferred that the heating be conducted in an inert atmosphere, although other atmospheres may be used. Inert atmospheres useful herein include, but are not limited to, nitrogen, helium and argon with an oxygen level less than 50 parts per million and preferably less than 15 parts per million. Heating may also be conducted at any effective atmospheric pressure from vacuum to above atmospheric and under any effective oxidizing or non-oxidizing gaseous environment such as those comprising air, $O_2$, oxygen plasma, ozone, ammonia, amines, moisture, $N_2O$, hydrogen, etc.

By the above method a thin (less than 5 μm) insoluble porous coating is produced on the substrate. Preferably the insoluble porous coatings have a thickness of 0.3 to 2.5 μm and a thickness of 0.5 to 1.2 μm being more preferable. The coating smoothes the irregular surfaces of the various substrates and has excellent adhesion properties.

Any method of heating such as the use of a quartz tube furnace, a convection oven, or radiant or microwave energy is generally functional herein. Similarly, the rate of heating is generally not a critical factor, but it is most practical and preferred to heat the coated substrate as rapidly as possible.

The insoluble porous coatings produced herein may be produced on any substrate. However, the coatings are particularly useful on electronic substrates. By "electronic substrate" it is meant to include silicon based devices and gallium arsenide based devices intended for use in the manufacture of a semiconductor component including focal plane arrays, opto-electronic devices, photovoltaic cells, optical devices, transistor-like devices, 3-D devices, silicon-on-insulator devices, super lattice devices and the like.

Additional coatings may be applied over the insoluble porous coating if desired. These can include, for example $SiO_2$ coatings, silicon containing coatings, silicon carbon containing coatings, silicon nitrogen containing coatings, silicon oxygen nitrogen containing coatings, silicon nitrogen carbon containing coatings and/or diamond like coatings produced from deposition (i.e. CVD, PECVD, etc.) of amorphous SiC:H, diamond, silicon nitride. Methods for the application of such coatings are known in the art. The method of applying an additional coating is not critical, and such coatings are typically applied by chemical vapor deposition techniques such as thermal chemical vapor deposition (TCVD), photochemical vapor deposition, plasma enhanced chemical vapor deposition (PECVD), electron cyclotron resonance (ECR), and jet vapor deposition. The additional coatings can also be applied by physical vapor deposition techniques such as sputtering or electron beam evaporation. These processes involve either the addition of energy in the form of heat or plasma to a vaporized species to cause the desired reaction, or they focus energy on a solid sample of the material to cause its deposition.

The insoluble porous coatings formed by this method are particularly useful as coatings on electronic devices such is integrated circuits. The dielectric constant of the insoluble porous coatings made by this method range from 1.5 to 3, with a range from 1.5 to 2.5 being more preferred for interlayer dielectric coatings. By the term "porous" it is meant an insoluble porous coating having a porosity of 1 to 60 volume percent. Porosity in the range of 10 to 60 volume percent is preferred. The modulus of the insoluble porous coatings ranges from 1.0 to 10 GPa.

EXAMPLES

The following non-limiting examples are provided so that one skilled in the art may more readily understand the invention. In the Examples weights are expressed as grams (g). Molecular weight is reported as weight average molecular weight (Mw) and number average molecular weight (Mn) determined by Gel Permeation Chromatography. Analysis of the siloxane resin composition was done using $^{29}Si$ nuclear magnetic resonance (NMR). Nitrogen adsorption porosimetry measurements were performed using a QuantaChrome Autosorb 1 MP system. The cured siloxane resins were ground into fine powders before being placed into the sample cell, degassed for several hours, and loaded into the analysis station. The surface area was determined by the Brunauer-Emmett-Teller method. The total pore volume was determined from the amount of vapor adsorbed into the pores at a relative pressure close to unity (P/Po=0.995) with the assumption that the pores filled with adsorbate. Skeletal density was measured using a helium gas pycnometer. Skeletal density represents the true density of the siloxane resin solid structure without including any interior voids, cracks or pores in the measurement. The percent porosity was calculated from the skeletal density and the total pore volume. Refractive Index (RI) and coating thickness were measured using a Woollam M-88 Spectroscopic Ellipsometer.

In the following examples Me stands for methyl and tBu stands for tertiary-butyl, AcO stands for acetoxy, and Et stands for ethyl. In the following tables, n.m. indicates the specified property was not measured.

Example 1

This example illustrates the formation of siloxane resin compositions where $R^1$ is hydrogen, $R^2$ is an organic group having 8 to 22 carbon atoms and $R^3$ is a t-butyl group. $HSi(OEt)_3$ (A), $(AcO)_2Si(OtBu)_2$ (B) and $R^2Si(OMe)_3$ (C) were added to 75 g of tetrahydrofuran (THF) in a flask under an argon atmosphere in the amounts described in Table 1. Deionized water (D) was then added to the flask and the mixture was stirred at room temperature for 1 hour. Then 75 g of toluene was added to the mixture. The solvent was removed using a rotary evaporator to yield a siloxane resin as a viscous oil, which was immediately dissolved into 150 g of toluene. The by-product acetic acid was removed as an azeotrope with toluene by heating to 38° C. under reduced pressure. The resin was again dissolved into toluene and azeotropically dried and heated in refluxing toluene for 1 h. The solution was filtered and the solvent removed by evaporation to yield the siloxane resin product. A summary of the resin synthesis is shown in Table 1. The $R^2$ group in $R^2Si(OMe)_3$ (C) is listed in Table 2. Analysis of the resin structure and molecular weight is shown in Table 3.

TABLE 1

Summary of Resin Synthesis

| Example No. | (A) (g) | (B) (g) | (C) (g) | (D) (g) | Toluene in reflux step (g) | Yield (g) | Appearance |
|---|---|---|---|---|---|---|---|
| 1-1 | 25.3 | 40.0 | 19.3 | 14.4 | 250 | 43.6 | Oil |
| 1-2 | 22.5 | 40.0 | 25.7 | 14.4 | 250 | 46.7 | Oil |
| 1-3 | 36.5 | 20.0 | 25.6 | 16.4 | 250 | 44.4 | Oil |
| 1-4 | 12.4 | 10.0 | 10.3 | 6.7 | 110 | 19.6 | Wax |
| 1-5 | 29.0 | 40.8 | 10.3 | 14.0 | 120 | 37.0 | Wax |
| 1-6 | 40.0 | 25.0 | 11.8 | 13.2 | 250 | 41.0 | Oil |
| 1-7 | 40.0 | 25.0 | 25.5 | 15.1 | 250 | 47.4 | Oil |
| 1-8 | 40.0 | 25.0 | 21.3 | 14.8 | 250 | 49.2 | Oil |
| 1-9 | 40.0 | 25.0 | 16.0 | 13.1 | 250 | 42.9 | Oil |

TABLE 2

| Example No. | $R^2$ group in (C) |
|---|---|
| 1-1 | $CH_3(CH_2)_{17}$— |
| 1-2 | $CH_3(CH_2)_{17}$— |
| 1-3 | $CH_3(CH_2)_{17}$— |
| 1-4 | $CH_3(CH_2)_{17}$— |
| 1-5 | $CH_3(CH_2)_{17}$— |
| 1-6 | $CH_3O(CH_2CH_2O)_{7-9}(CH_2)_3$— |
| 1-7 | $CH_3(CH_2)_{11}OCH_2CH_2$— |
| 1-8 | $(CH_3)_3CCH_2(CH_3)_2C(CH_3)_3CCH_2CHCH_2$— |
| 1-9 | $CF_3(CF_2)_5CH_2CH_2$— |

TABLE 3

Analysis of $(HSiO_{3/2})_f(R^2SiO_{3/2})_g((tBuO)_hSiO_{4-h/2})_h$ Resins

| Example | Molar ratio of f/g/h Based on reactants | Molar ratio of f/g/h ($^{29}Si$ NMR) | Mn | Mw |
|---|---|---|---|---|
| 1-1 | 0.45/0.15/0.40 | 0.46/0.13/0.41 | 9360 | 72,100 |
| 1-2 | 0.40/0.20/0.40 | 0.41/0.19/0.40 | 5660 | 80,200 |
| 1-3 | 0.65/0.20/0.15 | n.m. | n.m. | >100,00 |
| 1-4 | 0.55/0.20/0.25 | 0.54/0.18/0.24 | 8270 | 35,900 |
| 1-5 | 0.50/0.10/0.40 | n.m. | n.m. | n.m. |
| 1-6 | 0.48/0.09/0.43 | 0.42/0.04/0.54 | n.m. | n.m. |
| 1-7 | 0.43/0.18/0.39 | 0.43/0.14/0.43 | 2880 | 72,200 |
| 1-8 | 0.43/0.18/0.39 | 0.55/0.23/0.22 | 1450 | 19,700 |
| 1-9 | 0.48/0.083/0.44 | 0.47/0.05/0.48 | 9040 | 158,100 |

Example 2a

This example illustrates the formation of siloxane resin compositions where $R^1$ is hydrogen, $R^2$ is octadecyl and $R^3$ is a t-butyl group. $(MeO)_2SiCl_2$ was prepared by mixing 256.0 g (1.51 mol) of $SiCl_4$, 228.0 g (1.46 mol) of $Si(OMe)_4$ and 13.5 g (101.3 mmol) of $AlCl_3$ under a nitrogen atmosphere in a flask covered by aluminum foil to protect the reaction from UV/light. The mixture was stirred at room temperature for 17 days under the nitrogen atmosphere while continuing the UV/light protection. Unreacted chlorosilanes were distilled from the reaction mixture under vacuum and trapped in a Schlenk tube immersed in liquid nitrogen. The remaining product was distilled at 760 mm Hg to give several fractions characterized by $^{29}$Si NMR and included the following fractions enriched in $Cl_2Si(OMe)_2$:

Fraction 1 (b.p. 95° C., 70 m Hg) 87.0 g containing 44.0 weight % $Cl_3Si(OMe)$, 43.2 weight % $Cl_2Si(OMe)_2$ and 12.8 weight % $ClSi(OMe)_3$.

Fraction 2 (b.p. 102° C., 70 mm Hg) 119.0 g containing 8.5 weight % $Cl_3Si(OMe)$, 58.7 weight % $Cl_2Si(OMe)_2$ and 32.8 weight % $ClSi(OMe)_3$.

Example 2b $(MeO)_2Si(OtBu)_2$ was prepared by adding 119.0 g of fraction 2 above to 1.5 L (1.5 mol, in excess) of a 1M solution of Potassium t-butoxide/THF, under nitrogen at 0° C. Next 500 ml of anhydrous THF was added to the reaction mixture while stirring for 4 hours at reflux (65° C.). The solvent was evaporated at 20° C. under a vacuum of 100 mm Hg. The reaction product was washed several times with a pentane/diethyl ether mixture, filtered and distilled (92° C., 75 mm Hg) to give 79.5 grams of a colorless liquid characterized by $^{29}$Si NMR, $^{13}$C NMR, GC and GC-MS, containing 90.3 weight % $(MeO)_2Si(OtBu)_2$, 3.8 weight % $(MeO)_3Si(OtBu)$ and 5.9 weight % $(MeO) Si(OtBu)_3$.

Example 2c

A mixture of 5.48 g of the reaction product from example 2b, 8.70 g of $CH_3(CH_2)_{17}Si(OMe)_3$ and 7.62 g of $HSi(OEt)_3$ were added to 40 ml of MIBK followed by dropwise addition to a mixture comprising 80 ml MIBK, 40 ml toluene and 60 ml deionized water under a nitrogen atmosphere. The reaction mixture was refluxed at 120° C. overnight. After cooling, the reaction mixture was separated into 2 phases, water/insoluble materials and an organic phase. The organic phase was separated from the water/insoluble materials phase and dried using a dean stark trap. The solvent was evaporated using a rotovap giving 7.2 grams of a waxy solid, which was identified by $^{29}$Si NMR to be $CH_3SiO_{3/2})_{0.55}(CH_3(CH_2)_{17}SiO_{3/2})_{0.24}((tBuO)_bSiO_{4-b/2})_{0.21}$ with Mn of 3030 and Mw of 4410.

Example 3

This example illustrates the formation of siloxane resin compositions where $R^1$ is hydrogen, $R^2$ is a substituted phenylethyl group and $R^3$ is a t-butyl group under conditions similar to Example 1. $HSi(OEt)_3$ (A), $(AcO)_2Si(OtBu)_2$ (B) and para-$ZC_6H_4CH_2CH_2Si(OEt)_3$ (C) were added to 37 g of tetrahydrofuran (THF) in a flask under an argon atmosphere in the amounts described in Table 4. Deionized water (D) was then added to the solution and the mixture was stirred at room temperature overnight. 50 g of toluene was added to the reaction mixture. The solvent was removed using a rotary evaporator at 35 to 40° C. to yield a viscous liquid, which was immediately dissolved into 80 g of toluene. Residual acetic acid was removed as an azeotrope with toluene (azeotrope boiling point at 38° C.). The viscous liquid was added to 120 g toluene, 10 weight % as viscous liquid (based on total weight of toluene and viscous liquid), which was heated under reflux for 30 minutes and azeotropically dried and refluxed for 1 h. The solution was filtered and the solvent removed by evaporation to yield the final resin product. A summary of the resin synthesis is shown in Table 4. Analysis of the resin is shown in Table 5.

TABLE 4

Summary of Resin Synthesis

| Example No. | (A) (g) | (B) (g) | (C) para-$ZC_6H_4CH_2CH_2$—$Si(OEt)_3$ (g) | (D) (g) | Yield (g) |
|---|---|---|---|---|---|
| 3-1 | 5.6 | 5 | 9.6 (Z=Me) | 3.1 | 9.0 |
| 3-2 | 5.6 | 5 | 10.2 (Z=MeO) | 3.1 | 9.6 |
| 3-3 | 5.6 | 5 | 11.8 (Z=Br) | 3.1 | 10.8 |
| 3-4 | 5.6 | 5 | 9.2 (Z=H) | 6.7 | 8.8 |

TABLE 5

Analysis of $(HSiO_{3/2})_f(ZC_6H_4CH_2CH_2)SiO_{3/2})_g((tBuO)_bSiO_{4-b/2})_h$ Resins.

| Example | Molar ratio of f/g/h Based on reactants | Molar ratio of f/g/h based $^{29}$Si NMR | Mn | Mw |
|---|---|---|---|---|
| 3-1 | 0.25/0.5/0.25 | 0.27/0.5/0.23 | 580 | 1,400 |
| 3-2 | 0.25/0.5/0.25 | 0.21/0.51/0.28 | 480 | 930 |
| 3-3 | 0.25/0.5/0.25 | 0.25/0.47/0.28 | n.m. | 460 |
| 3-4 | 0.25/0.5/0.25 | 0.24/0.53/0.23 | n.m. | 600 |

Example 4

This example illustrates the formation of insoluble porous resins where $R^1$ is hydrogen, $R^2$ is an organic group having 8 to 22 carbon atoms and $R^3$ is a t-butyl group. Resins prepared in Example 1 and Example 2 (2 to 3 grams) were weighed into an alumina crucible and transferred into a quartz tube furnace. The furnace was evacuated to <20 mmHg (<2666 Pa) and backfilled with argon. The samples were heated to the temperatures shown in Table 6 at a rate of 50° C. to 60° C./minute and held at temperature for 2 hours before cooling to room temperature while under an argon purge. The cured materials obtained were transparent or slightly opaque thick films Pyrolysis conditions, char yields, TGA (Thermogravimetric Analysis) yields and porosity data by nitrogen absorption measurements are shown in Tables 6 and 7. Char Yield and TGA Yield are expressed as weight % retained after analysis at a specified temperature.

TABLE 6

Analysis of cured resins.

| Example No. | Resin Sample No. | Char Yield 450° C. (Wt %) | TGA Yield 450° C. (Wt. %) | TGA Yield 500° C. (Wt. %) | Pore Volume cm$^3$/g | Surface Area, BET, m$^2$/g |
|---|---|---|---|---|---|---|
| 4-1 | 1-1 | 51.9 | 73.8 | 56.4 | 0.701 | 1213 |
| 4-2 | 1-2 | 53.0 | 75.2 | 53.2 | 0.678 | 1123 |
| 4-3 | 1-3 | 53.9 | 77.5 | 57.9 | 0.623 | 1007 |
| 4-4 | 1-4 | 61.8 | 80.2 | 58.2 | 0.349 | 534 |
| 4-5 | 1-5 | 60.8 | 70.8 | 62.6 | 0.515 | 882 |
| 4-6 | 1-6 | 48.5 | 49.8 | 48.3 | 0.297 | 528 |
| 4-7 | 1-7 | 52.1 | 52.5 | 46.4 | 0.430 | 723 |
| 4-8 | 1-8 | 40.1 | 38.8 | 36.2 | 0.452 | 770 |
| 4-9 | 1-9 | 60.6 | 54.3 | 52.7 | 0.246 | 417 |
| 4-10 | 2c | n.m. | n.m. | n.m. | 0.457 | 752 |

TABLE 7

Analysis of cured resins.

| Example No. | Resin Sample No. | Skeletal Density G/cm³ | Pore Volume cm³/g | Porosity Wt. % | Surface Area, BET, m²/g |
|---|---|---|---|---|---|
| 4-1 | 1-1 | 1.669 | 0.701 | 53.9 | 1213 |
| 4-2 | 1-2 | 1.638 | 0.678 | 52.6 | 1123 |
| 4-3 | 1-3 | 1.337 | 0.623 | 45.4 | 1007 |
| 4-4 | 1-4 | 1.346 | 0.349 | 32.0 | 534 |
| 4-5 | 1-5 | 1.751 | 0.515 | 47.4 | 882 |

Example 5

This example illustrates the formation of insoluble porous coatings on a substrate where $R^1$ is hydrogen, $R^2$ is an organic group having 8 to 22 carbon atoms and $R^3$ is a t-butyl group. Resins prepared in Examples 1,2 and 3 (2 to 3g) were dissolved in MIBK to form a clear solution containing 25 weight % as resin. The solution was filtered through a 1.0 µm syringe membrane filter, then a 0.2 µm syringe membrane filter to remove any large particles. The solution was applied to a silicon wafer by spin coating at 2000 rpm for 20 seconds. The coated silicon wafers were put into a quartz tube furnace and the furnace was purged with nitrogen. The furnace was quickly heated to 450° C. (50° C. to 60° C./minute) and held at 450° C. for 2 hours, then cooled to room temperature while maintaining the nitrogen purge. The coated wafers were stored under a nitrogen atmosphere before the property measurements. Properties of the thin films are shown in Table 8.

TABLE 8

Thin film Properties of resins on silicon wafers, 450° C.

| Example No. | Resin Sample No. | Dk | Modulus, Gpa | Hardness, Gpa | Thickness, Å | RI |
|---|---|---|---|---|---|---|
| 5-1 | 1-1 | 2.30 | 3.4 | 0.53 | 9396 | 1.186 |
| 5-2 | 1-2 | 1.97 | 2.1 | 0.36 | 11795 | 1.173 |
| 5-3 | 1-3 | 1.70 | 1.8 | 0.31 | 15020 | 1.178 |
| 5-4 | 1-4 | 2.55 | 4.7 | 0.80 | 4921 | 1.288 |
| 5-5 | 1-5 | 2.25 | 4.4 | 0.36 | 14,532 | 1.165 |
| 5-6 | 1-6 | 2.67 | 6.9 | 0.63 | 7478 | 1.233 |
| 5-7 | 1-7 | 2.58 | 6.3 | 0.56 | 5737 | 1.231 |
| 5-8 | 1-8 | 2.72 | 8.0 | 0.66 | 4048 | 1.235 |
| 5-9 | 1-9 | 2.82 | 10.5 | 0.94 | 4244 | 1.266 |
| 5-10 | 2c | 2.18 | 2.0 | 0.39 | 3295 | 1.249 |
| 5-11 | 3-1 | 2.56 | 3.7 | 0.52 | 7697 | 1.339 |
| 5-12 | 3-2 | 2.89 | 6.0 | 0.94 | 7355 | 1.400 |
| 5-13 | 3-3 | n.m. | 5.9 | 0.81 | 6674 | 1.433 |
| 5-14 | 3-4 | 2.47 | 5.1 | 0.80 | 7372 | 1.342 |

Example 6

This example illustrates the formation of insoluble porous coatings on a substrate where $R^1$ is hydrogen, $R^2$ is an organic group having 8 to 22 carbon atoms, and $R^3$ is a t-butyl group under various cure temperatures. Resins prepared in Example 1 (2 to 3g) were dissolved in MIBK to form a clear solution containing 25 weight % as resin. The solution was filtered through a 1.0 µm syringe membrane filter, followed by a 0.2 µm syringe membrane filter to remove any large particles. The solution was applied to a silicon wafer by spin coating at 2000 rpm for 20 seconds. The coated silicon wafers were put into a quartz tube furnace and the furnace was purged with nitrogen. The furnace was heated 250, 390 and 450° C. and held at each temperature for 1 hour, respectively, then cooled to room temperature while maintaining the nitrogen purge. The coated wafers were stored under a nitrogen atmosphere before the property measurements. Properties of the thin films are shown in Table 9.

TABLE 9

Thin film Properties of resins on silicon wafers.

| Example No. | Resin Sample No. | Dk | Modulus, Gpa | Hardness, Gpa | Thickness, Å | RI Tyger |
|---|---|---|---|---|---|---|
| 6-1 | 1-1 | 2.17 | 2.3 | 0.24 | 11,580 | 1.215 |
| 6-2 | 1-3 | 1.80 | 1.2 | 0.14 | 11,749 | 1.206 |

Example 7

This example illustrates the formation of siloxane resin compositions where $R^1$ is methyl, $R^2$ is octadecyl and $R^3$ is a t-butyl group. $MeSi(OMe)_3$ (A), $(AcO)_2Si(OtBu)_2$ (B) and $CH_3(CH_2)_{17}Si(OMe)_3$ (C) were added to 75 g of THF in a flask under an argon atmosphere in the amounts described in Table 9. Deionized water (D) was then added to the solution and the mixture was stirred at room temperature for 1 hour. 75 g of toluene was added to the reaction mixture. The solvent was removed via evaporation using a rotary evaporator to yield the product as viscous oil, which was immediately dissolved into 150 g of toluene. Residual acetic acid was removed as an azeotrope with toluene under reduced pressure by heating to 38° C. The resin was again dissolved into 250 g of toluene and azeotropically dried and refluxed for 1 h. The solution was filtered and the solvent removed by evaporation to yield the final resin product. A summary on the resin synthesis is shown in Table 10. The molecular weight information for the resins is shown in Table 11.

TABLE 10

Summary of Resin Synthesis

| Example No. | (A) (g) | (B) (g) | (C) (g) | (D) (g) | Yield (g) | Appearance |
|---|---|---|---|---|---|---|
| 7-1 | 9.3 | 10.2 | 12.8 | 6.1 | 12.4 | Wax |
| 7-2 | 14.9 | 40 | 10.28 | 11.2 | 34.4 | Oil |
| 7-3 | 23.4 | 40.1 | 12.8 | 14.4 | 40.1 | Oil |
| 7-4 | 21.0 | 40.0 | 19.3 | 14.4 | 45.4 | Wax |
| 7-5 | 27.8 | 29.9 | 12.8 | 15.0 | 40.0 | Oil |

TABLE 11

Analysis of $(MeSiO_{3/2})_f(CH_3(CH_2)_{17}SiO_{3/2})_g((tBuO)_hSiO_{4-h/2})_h$ Resins.

| Example | Molar ratio of f/g/h Based on reactants | Mn | Mw |
|---|---|---|---|
| 7-1 | 0.55/0.20/0.25 | 6730 | 22,600 |
| 7-2 | 0.40/0.10/0.50 | 2790 | 18,300 |
| 7-3 | 0.50/0.10/0.40 | 1560 | 9800 |
| 7-4 | 0.45/0.15/0.40 | 1830 | 10,100 |
| 7-5 | 0.60/0.10/0.30 | 2470 | 8320 |

Example 8

This example illustrates the formation of insoluble porous resins where $R^1$ is methyl, $R^2$ is octadecyl and $R^3$ is a t-butyl group. Resins prepared in Example 7 (2 to 3g) were weighed into an alumina crucible and transferred into a quartz tube furnace. The furnace was evacuated to <20 mmHg (<2666 Pa) and backfilled with argon. The samples were heated to the temperatures shown in Table 12 at a rate of 50° C. to 60° C./minute and held at temperature for 2 hours before cooling to room temperature while under an argon purge. The cured materials obtained were transparent or slightly opaque thick. Pyrolysis conditions, char yields, TGA yields and porosity data by nitrogen absorption measurements are shown in Tables 12 and 13.

TABLE 12

Porosity and char yields of cured resins.

| Example No. | Resin Sample No. | Char Yield 450° C. (Wt %) | TGA Yield 450° C. (Wt. %) | TGA Yield 500° C. (Wt %) | Pore Volume cm$^3$/g | Surface Area, BET, m$^2$/g |
|---|---|---|---|---|---|---|
| 8-1 | 7-1 | 47.0 | 78.7 | 49.2 | 0.515 | 719 |
| 8-2 | 7-2 | 55.1 | 59.5 | 51.4 | 0.451 | 731 |
| 8-3 | 7-3 | 52.7 | 60.7 | 52.5 | 0.523 | 874 |
| 8-4 | 7-4 | 51.9 | 60.8 | 48.5 | 0.464 | 749 |
| 8-5 | 7-5 | 58.1 | 64.9 | 55.8 | 0.436 | 711 |

TABLE 13

Analysis of cured resins.

| Example No. | Resin Sample No. | Skeletal Density G/cm$^3$ | Pore Volume cm$^3$/g | Porosity Wt. % | Surface Area, BET, m$^2$/g |
|---|---|---|---|---|---|
| 8-1 | 7-1 | 1.380 | 0.515 | 41.5 | 719 |
| 8-2 | 7-2 | 1.591 | 0.451 | 41.8 | 731 |
| 8-3 | 7-3 | 1.429 | 0.523 | 42.8 | 874 |
| 8-4 | 7-4 | 1.508 | 0.464 | 41.2 | 749 |
| 8-5 | 7-5 | 1.447 | 0.436 | 38.7 | 711 |

Example 9

This example illustrates the formation of insoluble porous coatings on a substrate where $R^1$ is methyl, $R^2$ is octadecyl and $R^3$ is a t-butyl group. Resins prepared in Example 7 (2 to 3g) were dissolved in MIBK to form a clear solution containing 25 weight % as resin. The solution was filtered through a 1.0 μm syringe membrane filter followed by a 0.2 μm syringe membrane filter to remove any large particles. The solution was applied to a silicon wafer by spin coating at 2000 rpm for 20 seconds. The coated silicon wafers were put into a quartz tube furnace and the furnace was purged with nitrogen. The furnace was quickly heated to 450° C. (50° C. to 60° C./minute) and held at 450° C. for 2 hours, then cooled to room temperature while maintaining the nitrogen purge. The coated wafers were stored under a nitrogen atmosphere before the property measurements. Modulus and dielectric constants (Dk) of the thin films are shown in Table 14.

TABLE 14

Thin film Properties of resins on silicon wafers, 450° C.

| Example No. | Resin Sample No. | Dk | Modulus, Gpa | Hardness, Gpa | Thickness, Å | RI |
|---|---|---|---|---|---|---|
| 9-1 | 7-1 | 2.43 | 4.7 | 0.69 | 4921 | 1.295 |
| 9-2 | 7-2 | 2.19 | 3.2 | 0.47 | 7960 | 1.242 |
| 9-3 | 7-3 | 2.24 | 4.8 | 1.04 | 7030 | 1.266 |
| 9-4 | 7-4 | 2.02 | 3.3 | 0.80 | 7248 | 1.242 |
| 9-5 | 7-5 | 2.13 | 3.7 | 0.86 | 7622 | 1.274 |

Comparative Example 1

This example illustrates the formation of siloxane resin compositions where $R^1$ is hydrogen, $R^2$ is not present and $R^3$ is a t-butyl group. HSi(OEt)$_3$ (A) and (AcO)$_2$Si(OtBu)$_2$ (B) were added to 72 g of tetrahydrofuran (THF) in a flask under an argon atmosphere in the amounts described in Table 13. Deionized water (D) was then added to the flask and the mixture was stirred at room temperature for 1 hour. Then 75 g of toluene was added to the mixture. The solvent was removed via evaporation using a rotary evaporator to yield a siloxane resin as a viscous oil, which was immediately dissolved into 150 g of toluene. By-product acetic acid was removed as an azeotrope with toluene by heating to 38° C. under reduced pressure. The resin was again dissolved into 110 g of toluene and azeotropically dried and heated in refluxing toluene for 1 h. The solution was filtered and the solvent removed by evaporation to yield the siloxane resin product. A summary of the resin synthesis is shown in Table 15. The molecular weight information for the resins is shown in Table 16.

TABLE 15

Summary of Resin Synthesis

| Example No. | (A) (g) | (B) (g) | (D) (g) | Yield (g) | Appearance |
|---|---|---|---|---|---|
| C1-1 | 5.67 | 40.2 | 6.1 | 23.7 | Gum |
| C1-2 | 11.23 | 30.0 | 6.65 | 18.7 | Gum |
| C1-3 | 26.2 | 20.0 | 10.0 | 19.2 | Gum |

TABLE 16

Analysis of (HSiO$_{3/2}$)$_f$((tBuO)$_h$SiO$_{4-h/2}$)$_h$ Resins.

| Example | Molar ratio of f/h Based on reactants | Molar ratio of f/g Based $^{29}$Si NMR | Mn | Mw |
|---|---|---|---|---|
| C1-1 | 0.20/0.80 | 0.21/0.79 | 3,040 | 6,300 |
| C1-2 | 0.40/0.60 | 0.43/0.57 | 6,750 | 25,800 |
| C1-3 | 0.70/0.30 | n.m. | n.m. | n.m. |

Samples of the resins (2 to 3 g) were weighed into an alumina crucible and transferred into a quartz tube furnace. The furnace was evacuated to <20 mmHg (<2666 Pa) and backfilled with argon. The samples were heated to 450° C. at a rate of 50° C. to 60° C./minute and held at 450° C. for 1 hour before cooling to room temperature while under an argon purge. The cured siloxane resins were obtained as transparent or slightly opaque thick films. The pyrolysis temperature, Char Yield and porosity data are shown in Table 17. Char Yield is expressed as weight percent retained after analysis at the specified temperature.

TABLE 17

Porosity and char yields of cured resins.

| Resin Sample No. | Skeletal Density (g/cm³) | Char Yield (Wt %) | Pore Volume (cm³/g) | Porosity (%) | Surface Area, BET, (m²/g) |
|---|---|---|---|---|---|
| C1-1 | 1.970 | 45.8 | 0.313 | 38.1 | 550 |
| C1-2 | 1.982 | 51.4 | 0.317 | 38.6 | 559 |
| C1-3 | 1.787 | 65.0 | 0.224 | 28.6 | 392 |

Samples of the resins (2 to 3g) were dissolved in MIBK to form a clear solution containing 25 weight % as resin. The solution was filtered through a 1.0 µm syringe membrane filter followed by a 0.2 µm syringe membrane filter to remove any large particles. The solution was applied to a silicon wafer by spin coating at 2000 rpm for 20 seconds. The coated silicon wafers were put into a quartz tube furnace and the furnace was purged with nitrogen. The furnace was heated to 450° C. (50° C. to 60° C./minute) and held at temperature for 2 hours, then cooled to room temperature while maintaining the nitrogen purge. The coated wafers were stored under a nitrogen atmosphere before the property measurements. Modulus and dielectric constants (Dk) of the thin films are shown in Table 18.

TABLE 18

Thin film Properties of resins on silicon wafers

| Resin Sample No. | Dk | Modulus, Gpa | Hardness, Gpa | Thickness, Å | RI |
|---|---|---|---|---|---|
| C1-1 | 24.3 | 18.6 | 0.88 | 4,180 | 1.321 |
| C1-2 | 14.9 | 16.1 | 0.77 | 4,120 | 1.355 |
| C1-3 | 6.34 | 10.8 | 1.06 | 6,590 | 1.290 |

This example illustrates that siloxane resins where $R^1$ is hydrogen, $R^2$ is not present and $R^3$ is a t-butyl group result in very good modulus but unacceptably high Dk when compared with Examples 1 and 2. This example also shows that porosity is lower when compared to Examples 1 and 2 which contain both $R^2$ and $R^3$ groups.

Comparative Example 2

This example illustrates the formation of siloxane resin compositions where $R^1$ is methyl, $R^2$ is not present and $R^3$ is a t-butyl group. MeSi(OMe)₃ (A), (AcO)₂Si(OtBu)₂ (B) and THF were added to a flask under an argon atmosphere in the amounts described in Table 17. AcO stands for acetoxy, Me stands for methyl and tBu stands for tertiary-butyl. Deionized water was then added to the flask and the mixture was stirred at room temperature for 1 hour. 75 g of toluene was added to the reaction mixture. The solvent was removed via evaporation using a rotary evaporator to yield the product as viscous oil, which was immediately dissolved into 150 g of toluene. Residual acetic acid was removed as an azeotrope with toluene under reduced pressure (azeotrope boiling point at 38° C.). The resin was again dissolved into 110 g of toluene and azeotropically dried and refluxed for 1 h. The solution was filtered and the solvent removed by evaporation to yield the final resin product. A summary of the resin synthesis is shown in Table 19. The molecular weight information for the resins is shown in Table 20.

TABLE 19

Summary of Resin Synthesis

| Comparative Example No. | (A) (g) | (B) (g) | THF (g) | H₂O (g) | Yield (g) | Appearance |
|---|---|---|---|---|---|---|
| C2-1 | 18.6 | 40.0 | 72.0 | 11.1 | 23.6 | Solid |
| C2-2 | 27.9 | 40.0 | 80.0 | 14.5 | 26.0 | Solid |
| C3-3 | 43.5 | 40.3 | 90.0 | 20.0 | 40.0 | Solid |
| C3-4 | 92.9 | 39.9 | 120.3 | 28.3 | 67.3 | Wax |

TABLE 20

Analysis of (MeSiO₃/₂)f(tBuO)hSiO₄₋ₕ/₂)h Resins.

| Example | Molar ratio of f/h Based on reactants | Molar ratio of f/g Based on ²⁹Si NMR | Mn | Mw |
|---|---|---|---|---|
| C2-1 | 0.50/0.50 | 0.44/0.56 | 2,990 | 17,700 |
| C2-2 | 0.60/0.40 | 0.55/0.44 | 2,010 | 46,000 |
| C2-3 | 0.70/0.30 | 0.69.0.31 | n.m. | >100,000 |
| C2-4 | 0.85/0.15 | 0.83/0.17 | 3,400 | 32,100 |

Samples of the resins (2 to 3 g) were weighed into an alumina crucible and transferred into a quartz tube furnace. The furnace was evacuated to <20 mmHg (<2666 Pa) and backfilled with argon. The samples were heated to 450° C. at a rate of 10° C./minute and held at 450° C. for 1 hour before cooling to room temperature while under an argon purge. The cured siloxane resins were obtained as transparent or slightly opaque thick films. The pyrolysis temperature, Char Yield and porosity data are shown in Table 21. Char Yield is expressed as weight percent retained after analysis at the specified temperature.

TABLE 21

Porosity and char yields of cured resins.

| Resin Sample No. | Skeletal Density (g/cm³) | Char Yield (Wt %) | Pore Volume (cm³/g) | Porosity (%) | Surface Area, BET, (m²/g) |
|---|---|---|---|---|---|
| C2-1 | 1.693 | 60.5 | 0.271 | 31.4 | 461 |
| C2-2 | 1.624 | 72.5 | 0.280 | 31.3 | 481 |
| C2-3 | 1.505 | 78.0 | 0.249 | 27.2 | 425 |
| C2-4 | 1.398 | 76.5 | 0.125 | 14.9 | 168 |

Samples of the resins (2 to 3g) were dissolved in MIBK to form a clear solution containing 25 weight % as resin. The solution was filtered through a 1.0 µm syringe membrane filter followed by a 0.2 µm syringe membrane filter to remove any large particles. The solution was applied to a silicon wafer by spin coating at 2000 rpm for 20 seconds. The coated silicon wafers were put into a quartz tube furnace and the furnace was purged with nitrogen. The furnace was heated to the temperature indicated in Table 21 (50° to 60° C./minute) and held at temperature for 2 hours, then cooled to room temperature while maintaining the nitrogen purge. The coated wafers were stored under a nitrogen atmosphere before the property measurements. Modulus and dielectric constants (Dk) of the thin films are shown in Table 21.

TABLE 21

Thin film Properties of resins on silicon wafers

| Resin Sample No. | Temperature °C. | Dk | Modulus, Gpa | Hardness, Gpa | Thickness Å | RI |
|---|---|---|---|---|---|---|
| C2-1 | 450 | 2.32 | 7.9 | 0.91 | 6,300 | 1.273 |
| C2-1 | 425 | 2.36 | 9.0 | 1.11 | 6,728 | 1.276 |
| C2-1 | 400 | 2.48 | 8.7 | 0.95 | 6,826 | 1.271 |
| C2-2 | 450 | 2.16 | 3.5 | 0.51 | 6,199 | 1.252 |
| C2-2 | 425 | 2.48 | 5.5 | 0.65 | 6,374 | 1.307 |
| C2-2 | 400 | 2.55 | 4.8 | 0.53 | 6,333 | 1.338 |
| C2-3 | 450 | 2.61 | 7.4 | 1.11 | 8,551 | 1.347 |
| C2-3 | 425 | 2.52 | 6.9 | 1.08 | 9,025 | 1.350 |
| C2-3 | 400 | 2.38 | 7.4 | 1.19 | 9,413 | 1.336 |
| C2-4 | 450 | 2.88 | 7.8 | 1.4 | 10,500 | 1.368 |
| C2-4 | 425 | 2.71 | 6.0 | 1.19 | 10,525 | 1.383 |
| C2-4 | 400 | 2.63 | 7.1 | 1.25 | 10,892 | 1.375 |

This example illustrates that siloxane resins where $R^1$ is methyl, $R^2$ is not present and $R^3$ is a t-butyl group result in good Dk but porosity is lower when compared to Example 7 which contains both $R^2$ and $R^3$ groups.

Comparative Example 3

This example illustrates the formation of siloxane resin compositions where $R^1$ is hydrogen, $R^2$ is octadecyl and $R^3$ is not present. Two solutions of a hydrogen silsesquioxane resin having a weight average molecular weight of 70,000, prepared by the method of Collins et al., U.S. Pat. No. 3,615,272, dissolved in toluene were reacted with 1-octadecene at 110° C. in the presence of $1.2 \times 10^{-5}$ weight parts of platinum in the form of a complex with 1,3-diethenyl- 1,1,3,3-tetramethyldisiloxane for 2 hours. A 2 g sample of each resin solution after reaction was placed into a ceramic crucible, heated at 350° C. in nitrogen for 0.5 hour, and then heated at 500° C. in nitrogen for 1 hour. A sample of each resin solution was diluted with toluene to 17 weight % and applied to a silicon wafer by spin coating and cured as described in Example 5 and dielectric constant was measured. Table 22 shows the weight parts of solvent and 1-octadecene used per 1 weight part of hydrogen silsesquioxane resin, porosity and dielectric constant for each sample. Sample C3-3 is the hydrogen silsesquioxane resin solution in toluene which was, not reacted with 1-octadecene.

TABLE 22

Analysis of $(HSiO_{3/2})_f(CH_3(CH_2)_{17}SiO_{3/2})_g$ Resins

| Comparative Example no. | Wt. Parts of toluene | Wt. Parts of octadecene | Molar ratio of f/g Based on Reactants | Porosity % | Dk |
|---|---|---|---|---|---|
| C3-1 | 2.22 | 1.60 | 0.66/0.34 | 27.1 | 2.1 |
| C3-2 | 2.72 | 1.10 | 0.77/0.23 | 27.9 | 2.2 |
| C3-3 | 4.72 | 0 | 1.0/0 | 0 | 3.0 |

This example illustrates that siloxane resins where $R^1$ is hydrogen, $R^2$ is octadecyl and $R^3$ is not present result in good Dk but porosity is lower when compared to Examples 1 and 2 which contains both $R^2$ and $R^3O$ groups.

What is claimed is:

1. A siloxane resin composition comprising $R^1SiO_{3/2}$ siloxane units and $(R^2O)_bSiO_{(4-b)/2}$ siloxane units wherein $R^1$ is independently selected from the group consisting of alkyl having 1 to 5 carbon atoms, $R^2$ is independently selected from the group consisting of branched alkyl groups having 3 to 30 carbon atoms and branched substituted alkyl groups having 3 to 30 carbon atoms, b is from 1 to 3, the siloxane resin contains a molar ratio of $R^1SiO_{3/2}$ units to $(R^2O)_bSiO_{(4-b)/2}$ units of 1:99 to 99:1 and the sum of $R^1SiO_{3/2}$ units and $(R^2O)_bSiO_{(4-b)/2}$ units is at least 50 percent of the total siloxane units in the resin composition.

2. The siloxane resin composition as claimed in claim 1, wherein the molar ratio of $R^1SiO_{3/2}$ units to $(R^2O)_bSiO_{(4-b)/2}$ units is 40:60 to 98:2 and the sum of $R^1SiO_{3/2}$ units and $(R^2O)_bSiO_{(4-b)/2}$ units is at least 70 percent of the total siloxane units in the siloxane resin composition.

3. The siloxane resin composition as claimed in claim 1, wherein $R^1$ is methyl and $R^2$ is a tertiary alkyl having 4 to 18 carbon atoms.

4. The siloxane resin composition as claimed in claim 1, wherein $R^2$ is t-butyl.

5. A method for preparing a siloxane resin comprising $R^1SiO_{3/2}$ siloxane units and $(R^2O)_bSiO_{(4-b)/2}$ siloxane units where b is from 1 to 3, which comprises:
combining
(a) a silane or a mixture of silanes of the formula $R^1SiX_3$, where each $R^1$ is independently selected from the group consisting of alkyl having 1 to 5 carbon atoms, where X is a independently a hydrolyzable group or a hydroxy group;
(b) a silane or a mixture of silanes of the formula $(R^2O)_cSiX_{(4-c)}$, where $R^2$ is independently selected from the group consisting of branched alkyl groups having 3 to 30 carbon atoms and branched substituted alkyl groups having 3 to 30 carbon atoms, c is from 1 to 3, X is a hydrolyzable group or a hydroxy group, silane (a) and silane (b) are present in a molar ration of silane (a) to silane (b) of 1:99 to 99:1; and
(c) water, for a time and temperature sufficient to effect the formation of the siloxane resin.

6. The method as claimed in claim 5 further comprising a solvent.

7. The method as claimed in claim 5, wherein $R^1$ is methyl and $R^2$ is a tertiary alkyl group having 4 to 18 carbon atoms.

8. The method as claimed in claim 5, wherein $R^1$ is methyl and $R^2$ is t-butyl.

9. The method as claimed in claim 5, wherein the water is present in a range from 0.5 to 2.0 moles of water per mole of X in silane (a) and silane (b).

10. A method of forming an insoluble porous resin, which comprises:
(A) heating the siloxane resin of claim 1 for a time and temperature sufficient to effect curing of the siloxane resin,
(B) further heating the siloxane resin for a time and temperature sufficient to effect removal of the $R^2O$ groups from the cured siloxane resin, thereby forming an insoluble porous resin.

11. The method as claimed in claim 10, where the heating in step (A) is from greater than 20° C. to 350° C. and the further heating in step (B) is from greater than 350° C. to 600° C.

12. The method as claimed in claim 10, where the curing of the siloxane resin and removal of the $R^2O$ groups from the cured siloxane resin is done in a single step.

13. The method as claimed in claim 10, wherein the insoluble porous resin has dielectric constant from 2.1 to 3.0, a porosity from 2 to 40 volume percent and a modulus from 1.9 to 20 GPa.

14. A method of forming an insoluble porous coating on a substrate comprising the steps of (A) coating the substrate with a coating composition comprising a siloxane resin composition comprising $R^1SiO_{3/2}$ siloxane units, and $(R^2O)_bSiO_{(4-b)/2}$ siloxane units wherein $R^1$ is independently selected from the group consisting of alkyl having 1 to 5 carbon atoms and $R^2$ is independently selected from the group consisting of branched alkyl groups having 3 to 30 carbon atoms and substituted branched alkyl groups having 3 to 30 carbon atoms, b is from 1 to 3, the siloxane resin composition contains a molar ratio of $R^1SiO_{3/2}$ units to $(R^2O)_bSiO_{(4-b)/2}$ units of 1:99 to 99:1 and the sum of $R^1SiO_{3/2}$ units and $(R^2O)_bSiO_{(4-b)/2}$ units is at least 50 percent of the total siloxane units in the resin composition;

(B) heating the coated substrate for a time and temperature sufficient to effect curing of the coating composition, and (C) further heating the coated substrate for a time and temperature sufficient to effect removal of the $R^2O$ groups from the cured coating composition, thereby forming an insoluble porous coating on the substrate.

15. The method as claimed in claim 14, where the heating in step (B) is from greater than 20° to 350° C. and the further heating in step (C) is from greater than 350° to 600° C.

16. The method as claimed in claim 14, where the curing and removal of the $R^2O$ groups is done in a single step at a temperature within a range of greater than 20° to 600° C.

17. The method as claimed in claim 16, where the removal of the $R^2O$ groups is done at a temperature within a range of greater than 350° C. to 600° C.

18. The method as claimed in claim 14, wherein the insoluble porous coating has a dielectric constant in the range of 2.1 to 3.0, a porosity of 2 to 40 volume percent, and a modulus in the range of 1.9 to 20 GPa.

19. An electronic substrate having an insoluble porous coating prepared by the method of claim 14.

* * * * *